(12) United States Patent
Nakao et al.

(10) Patent No.: US 8,167,521 B2
(45) Date of Patent: May 1, 2012

(54) SUBSTRATE TRANSFER APPARATUS AND VERTICAL HEAT PROCESSING APPARATUS

(75) Inventors: Ken Nakao, Nirasaki (JP); Hitoshi Kato, Nirasaki (JP); Junichi Hagihara, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 863 days.

(21) Appl. No.: 12/225,920

(22) PCT Filed: Apr. 23, 2007

(86) PCT No.: PCT/JP2007/058702
§ 371 (c)(1),
(2), (4) Date: Oct. 2, 2008

(87) PCT Pub. No.: WO2007/129558
PCT Pub. Date: Nov. 15, 2007

(65) Prior Publication Data
US 2009/0175705 A1 Jul. 9, 2009

(30) Foreign Application Priority Data

May 9, 2006 (JP) ................................ 2006-130492
Jan. 16, 2007 (JP) ................................ 2007-007220

(51) Int. Cl.
*H01L 21/677* (2006.01)
(52) U.S. Cl. ...................................... 414/172; 294/64.2
(58) Field of Classification Search .................. 414/217, 414/416.08, 940, 172; 294/64.2, 64.3
See application file for complete search history.

(56) References Cited

U.S. PATENT DOCUMENTS

| | | | | |
|---|---|---|---|---|
| 4,029,351 A | * | 6/1977 | Apgar et al. ........... | 294/64.3 |
| 4,773,687 A | * | 9/1988 | Bush et al. ........... | 414/752.1 |
| 5,067,762 A | * | 11/1991 | Akashi ........... | 294/64.3 |
| 6,095,582 A | * | 8/2000 | Siniaguine et al. ........... | 294/64.3 |
| 6,256,555 B1 | * | 7/2001 | Bacchi et al. ........... | 700/245 |

(Continued)

FOREIGN PATENT DOCUMENTS

JP 63-84042 4/1988

(Continued)

OTHER PUBLICATIONS

Supplementary European Search Report dated on Oct. 28, 2009 for European Application No. 07 74 2137.

(Continued)

*Primary Examiner* — Charles A Fox
(74) *Attorney, Agent, or Firm* — Smith, Gambrell & Russell, LLP

(57) ABSTRACT

The present invention restrains, during a transfer of a substrate, a central portion of the substrate from being warped by its own weight, which might be caused by a super-enlargement of a diameter of the substrate. A substrate transfer apparatus 18 includes: a support part 17 which is moved above a substrate w of a large diameter; and an upside grip mechanism 28 disposed on the support part 17, the upside grip mechanism 28 capable of supporting a peripheral portion of the substrate w from above. The support part 17 is provided with a non-contact sucking and holding part 30 having a suction hole 31 and a blow hole 32. The non-contact sucking and holding part 30 sucks and holds the substrate w in a non-contact manner, by blowing a gas onto the central portion of the upper surface of the substrate w and sucking the central portion to form an air layer 50 such that the central portion of the wafer w is not warped.

10 Claims, 8 Drawing Sheets

U.S. PATENT DOCUMENTS

| | | | |
|---|---|---|---|
| 6,322,116 B1 * | 11/2001 | Stevens | 294/64.3 |
| 6,390,754 B2 * | 5/2002 | Yamaga et al. | 414/217 |
| 6,615,113 B2 * | 9/2003 | Kretz et al. | 700/258 |
| 6,623,235 B2 * | 9/2003 | Yokota et al. | 414/744.8 |
| 6,752,585 B2 * | 6/2004 | Reimer et al. | 414/783 |
| 7,144,056 B2 * | 12/2006 | Casarotti et al. | 294/186 |
| 2004/0227924 A1 | 11/2004 | Willems Van Dijk et al. | |
| 2007/0199860 A1 | 8/2007 | Asari et al. | |
| 2008/0129064 A1 * | 6/2008 | Harvey | 294/64.3 |

FOREIGN PATENT DOCUMENTS

| | | |
|---|---|---|
| JP | 2-138044 | 5/1990 |
| JP | 5-33010 | 8/1993 |
| JP | 6-40560 | 2/1994 |
| JP | 6-271009 | 9/1994 |
| JP | 11-165868 | 6/1999 |
| JP | 2000-306973 | 11/2000 |
| JP | 2001-351965 | 12/2001 |
| JP | 2002-289673 | 10/2002 |
| JP | 2003-321117 | 11/2003 |
| JP | 2003-338531 | 11/2003 |
| JP | 2004-11005 | 1/2004 |
| JP | 2004-79569 | 3/2004 |
| JP | 2004-99261 | 4/2004 |
| JP | 2004-140057 | 5/2004 |
| JP | 2005-26667 | 1/2005 |
| JP | 2005-191464 | 7/2005 |
| JP | 2005-311306 | 11/2005 |
| JP | 2006-88235 | 4/2006 |
| WO | 03/086917 | 10/2003 |
| WO | 2005/093354 | 10/2005 |
| WO | 2006/013808 | 2/2006 |

OTHER PUBLICATIONS

Japanese Office Action issued on Jan. 19, 2010 for Japanese Application No. 2007-007220 w/ English language translation.

Japanese Office Action issued on Jul. 27, 2010 for Japanese Application No. 2007-007220 w/ English language translation.

PCT Notification of Transmittal of Translation of the International Preliminary Report on Patentability(Form PCT/IB/338) dated Jan. 2004.

PCT International Preliminary Report on Patentability (Form PCT/IPEA/409) dated Apr. 2005.

* cited by examiner

SUBSTRATE TRANSFER APPARATUS AND VERTICAL HEAT PROCESSING APPARATUS

FIELD OF THE INVENTION

The present invention relates to a substrate transfer apparatus and a vertical heat processing apparatus. More particularly, the present invention pertains to a technique for restraining a warp of a substrate of a large diameter, when the substrate is held from above and transferred.

BACKGROUND ART

When a semiconductor device is manufactured, there are steps for subjecting a substrate, such as a semiconductor wafer, to various heat processes, such as an oxidation process, a diffusion process, a CVD process, and an annealing process. As one of heat processing apparatuses for performing these steps, there is used a vertical heat processing apparatus (semiconductor manufacturing apparatus) capable of thermally processing a number of wafers at a time.

This vertical heat processing apparatus includes: a heat processing furnace having a furnace opening in a lower part thereof; a lid member that hermetically seals the furnace opening; a holder (also referred to as "boat") disposed on the lid member, the holder capable of holding a number of wafers at predetermined intervals therebetween in an up and down direction via ring-shaped support plates; an elevating mechanism that elevates and lowers the lid member so as to load and unload the holder into and from the heat processing furnace; and a substrate transfer apparatus having a plurality of support parts (also referred to as "forks") at predetermined intervals therebetween, the substrate transfer apparatus capable of transferring (conveying) wafers between a container (also referred to as "FOUP") capable of containing wafers at predetermined intervals therebetween and the holder. The ring-shaped support plate is used as a countermeasure for restraining or preventing a slip (crystal defect) from being generated on a peripheral portion of a wafer during a heat process of a high temperature.

As a conventional substrate transfer apparatus, there has been known an apparatus including a plurality of stopping members that are engaged with a lower surface of a peripheral portion of a wafer to support the wafer in a suspending manner. The respective stopping members can move in a reciprocating manner between a wafer support position in which a wafer is supported in a suspending manner, and a wafer disengagement position in which the supported condition of the wafer is released by the stopping members that have been moved outside an outer periphery of the wafer. The respective stopping members are driven by an actuator between the wafer support position and the wafer disengagement position in a reciprocating manner. (See, Patent Document 1).

However, in the substrate transfer apparatus, there is a problem in that a structure thereof is complicated because the stopping members, which are located on a front end side and a rear end side of a support part, are made movable. As a substrate transfer apparatus or a vertical heat processing apparatus capable of solving this problem, there has been proposed that an upside grip mechanism for supporting a wafer from above is disposed on a lower part of a fork, the grip mechanism having a fixed stopping part disposed on a front end of the fork so as to stop a front periphery of a wafer, and a movable stopping part disposed on a rear end of the fork so as to disengageably stop a rear periphery of the wafer (Patent Document 2).

Patent Document 1: 2003-338531A
Patent Document 2: 2005-311306A

In accordance with an enlarged diameter of a wafer (300 mm in diameter) and a super-enlarged diameter of a next-generation wafer (400 to 450 mm in diameter), there is fear that, in a current substrate transfer apparatus or a current vertical heat processing apparatus, a central portion of a wafer is warped by its own weight. There is also fear that the warp invites a stress on the wafer and impairs a transfer precision (it is necessary to consider a size or a space of the warp in the central portion of the wafer).

DISCLOSURE OF THE INVENTION

The present invention has been made in view of the above circumstances. The object of the present invention is to provide a substrate transfer apparatus and a vertical heat processing apparatus capable of restraining or preventing, during a transfer of a substrate, a central portion of the substrate from being warped by its own weight, which might be caused by an enlargement or a super-enlargement of a diameter of the substrate.

The present invention is a substrate transfer apparatus comprising: a support part configured to be located near a substrate of a large diameter; and a grip mechanism disposed on the support part, the grip mechanism being capable of gripping and supporting a peripheral portion of the substrate;

wherein the support part is provided with a non-contact sucking and holding part having a blow hole that blows a gas onto the substrate, and a suction hole that sucks the gas between the support part and the substrate, so that a gas layer for preventing a warp of a central portion of the wafer is formed between the support part and the substrate.

The present invention is the substrate transfer apparatus wherein the support part is located above the substrate, and the non-contact sucking and holding part forms the gas layer between the support part and an upper surface of the substrate.

The present invention is the substrate transfer apparatus wherein the support part is located below the substrate, and the non-contact sucking and holding part forms the gas layer between the support part and a lower surface of the substrate.

The present invention is the substrate transfer apparatus wherein the non-contact sucking and holding part includes one or more non-contact sucking and holding unit having the suction hole located at a center of the unit, and the plurality of blow holes located around the suction hole.

The present invention is the substrate transfer apparatus wherein the support part is provided with a blow nozzle for rotation that rotates the substrate by blowing a gas onto the substrate in a tangential direction, and a positioning part that arranges the substrate in position by detecting a positioning mark on the substrate.

The present invention is the substrate transfer apparatus wherein the support part is provided with a displacement sensor that optically detects an inclination of the substrate, and a posture control mechanism that makes the support part in parallel with the substrate based on a detection signal from the displacement sensor.

The present invention is the substrate transfer apparatus wherein a reference plate is disposed near the support part, the reference plate is provided with a displacement sensor that optically detects an inclination of the substrate, and there is installed a posture control mechanism that makes the support part in parallel with the substrate based on a detection signal from the displacement sensor.

The present invention is a vertical heat processing apparatus comprising: a heat processing furnace having a furnace opening in a lower part thereof; a lid member configured to hermetically seal the furnace opening; a holder disposed on the lid member, the holder being capable of holding a plurality of substrates of a large diameter at predetermined intervals therebetween in a vertical direction through ring-shaped support plates; an elevating mechanism configured to elevate and lower the lid member so as to load and unload the holder into and from the heat processing furnace; and a substrate transfer apparatus configured to support a substrate in a substantially horizontal state, and to transfer the substrate between a container capable of containing a plurality of substrates at predetermined intervals therebetween, and the holder; wherein the substrate transfer apparatus comprises: a support part configured to be located near a substrate of a large diameter; and a grip mechanism disposed on the support part, the grip mechanism being capable of gripping and supporting a peripheral portion of the substrate; wherein the support part is provided with a non-contact sucking and holding part having a blow hole that blows a gas onto the substrate, and a suction hole that sucks the gas between the support part and the substrate, so that a gas layer for preventing a warp of a central portion of the wafer is formed between the support part and the substrate.

The present invention is the vertical heat processing apparatus wherein the support part is located above the substrate, and the non-contact sucking and holding part forms the gas layer between the support part and an upper surface of the substrate.

The present invention is the vertical heat processing apparatus wherein the support part is located below the substrate, and the non-contact sucking and holding part forms the gas layer between the support part and a lower surface of the substrate.

The present invention is the vertical heat processing apparatus wherein the non-contact sucking and holding part includes one or more non-contact sucking and holding unit having the suction hole located at a center of the unit, and the plurality of blow holes located around the suction hole.

The present invention is the vertical heat processing apparatus wherein the support part is provided with a blow nozzle for rotation that rotates the substrate by blowing a gas onto the substrate in a tangential direction, and a positioning part that arranges the substrate in position by detecting a positioning mark on the substrate.

The present invention is the vertical heat processing apparatus wherein the support part is provided with a displacement sensor that optically detects an inclination of the substrate, and a posture control mechanism that makes the support part in parallel with the substrate based on a detection signal from the displacement sensor.

The present invention is the vertical heat processing apparatus wherein a reference plate is disposed near the support part, the reference plate is provided with a displacement sensor that optically detects an inclination of the substrate, and there is installed a posture control mechanism that makes the support part in parallel with the substrate based on a detection signal from the displacement sensor.

According to the present invention, a central portion of a substrate can be sucked and held by the non-contact sucking and holding part through a gas layer in a non-contact manner, whereby it is possible to restrain or prevent, during a transfer of a substrate, a central portion of the substrate from being warped by its own weight, which might be caused by a super-enlargement of a diameter of the substrate. As a result, it is possible to restrain or prevent generation of a stress and deterioration of a transfer precision, which might be caused by the warp of the substrate.

BEST MODE FOR CARRYING OUT THE INVENTION

Figure 1:
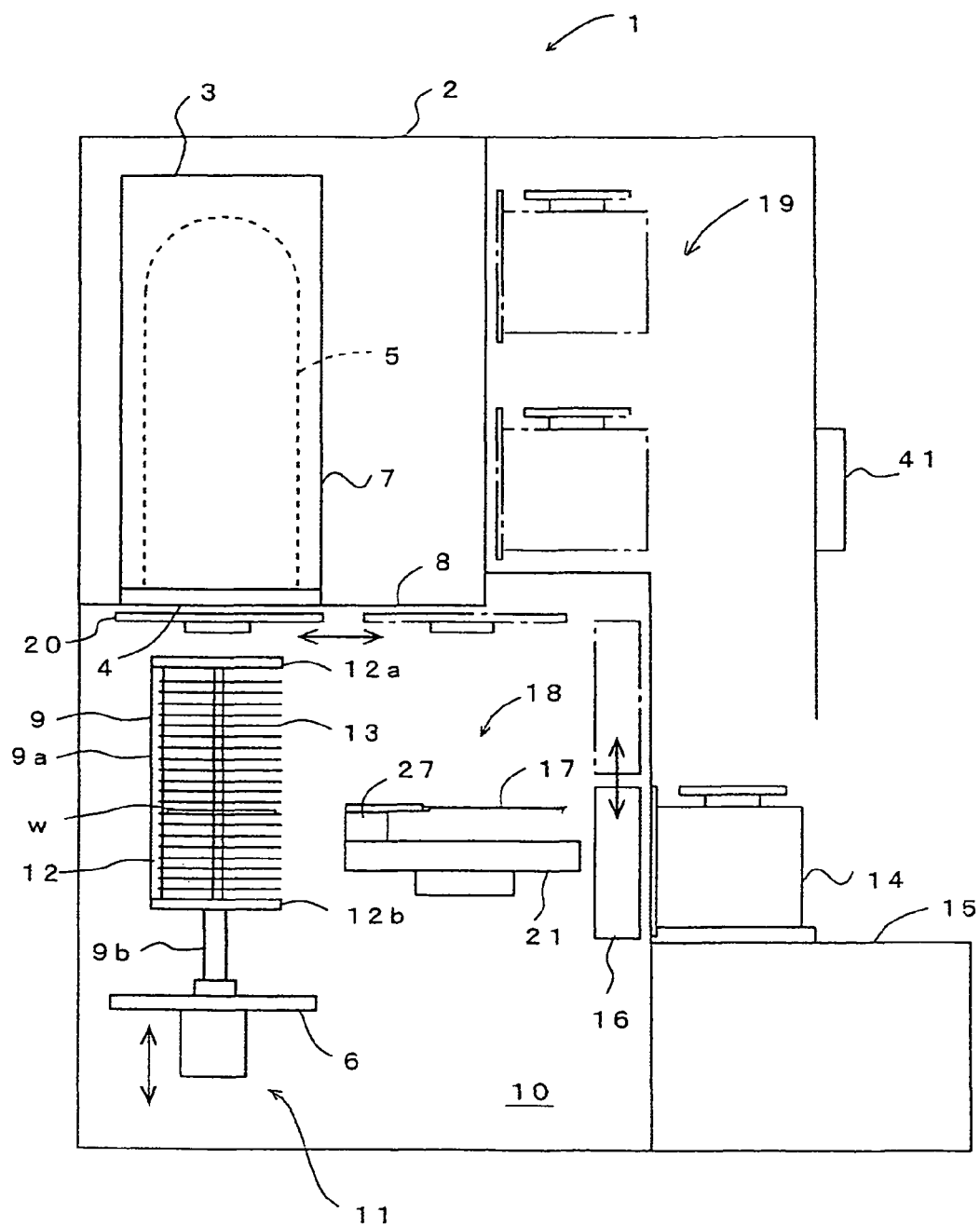
FIG. 1 is a longitudinal sectional view schematically showing an embodiment of a vertical heat processing apparatus of the present invention.
Figure 2:
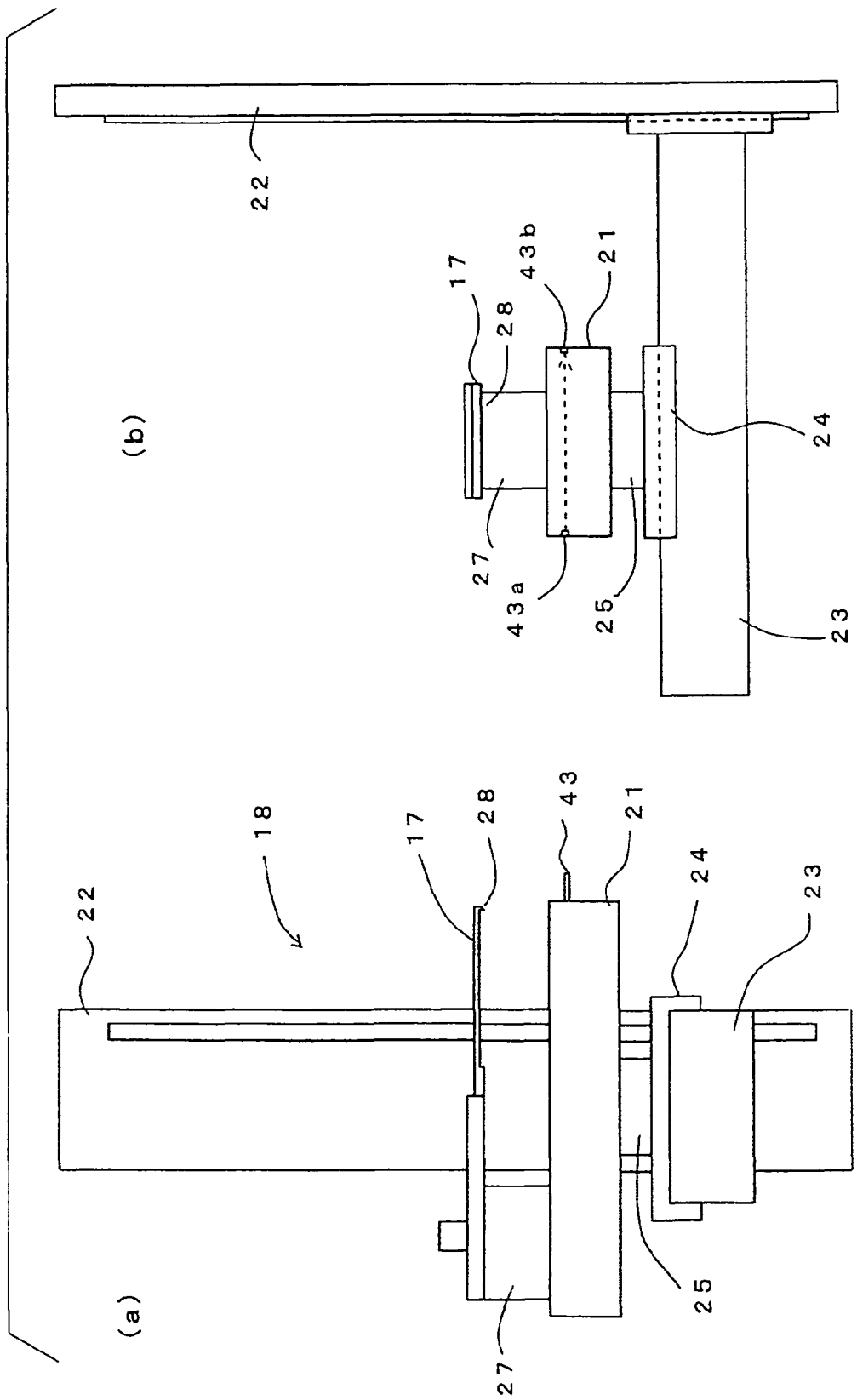
FIG. 2(a) is a front view schematically showing a substrate transfer apparatus.
FIG. 2(b) is a side view thereof.
Figure 3:
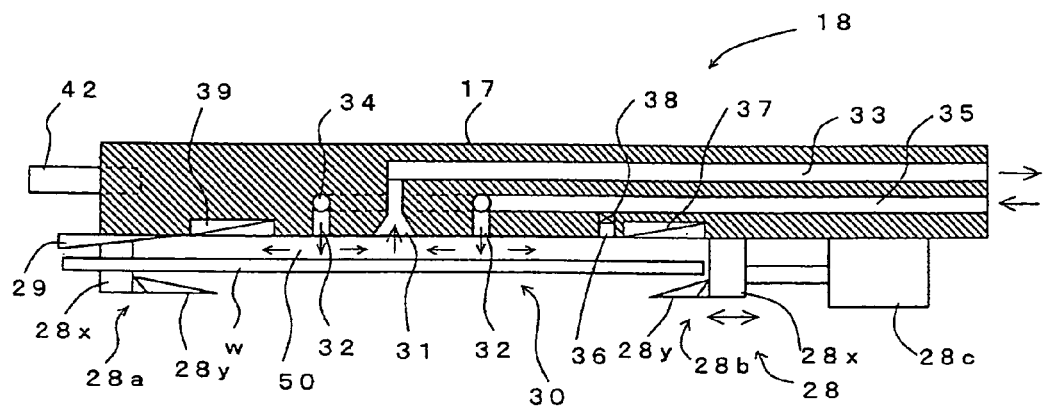
FIG. 3 is a longitudinal sectional view of a support part.
Figure 4:
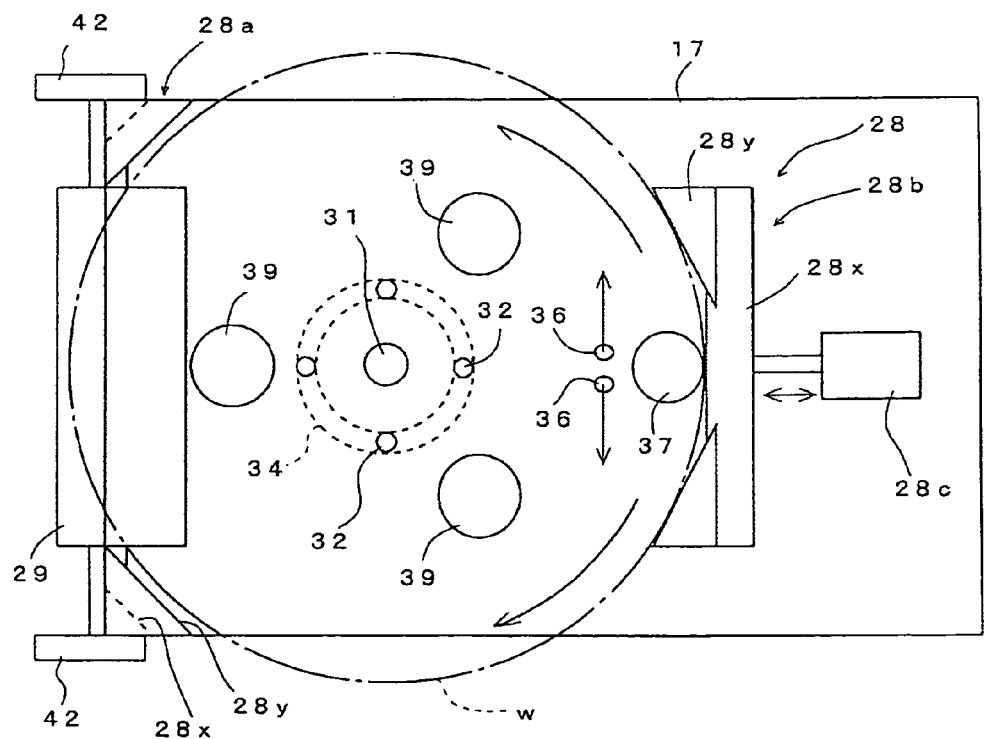
FIG. 4 is a bottom view of the support part.

The best mode for carrying out the present invention is described in detail below with reference to the drawings. FIG. 1 is a longitudinal sectional view schematically showing an embodiment of a vertical heat processing apparatus according to the resent invention. FIG. 2(a) is a front view schematically showing a substrate transfer apparatus, and FIG. 2(b) is a side view thereof. FIG. 3 is a longitudinal sectional view of a support part. FIG. 4 is a bottom view of the support part.

In the drawings, the reference number 1 depicts a vertical heat processing apparatus (semiconductor manufacturing apparatus). The vertical heat processing apparatus 1 includes a housing 2 defining an outer contour, and a vertical heat processing furnace 3 disposed in an upper part of the housing 2. The heat processing furnace 3 is capable of containing a substrate, such as a thin, discoid semiconductor wafer w of a large diameter (300 mm in diameter or 400 to 450 mm in diameter), and subjecting the wafer w to a predetermined process such as a CVD process. The heat processing furnace 3 includes an elongated processing vessel, such as a quartz reaction tube 5, having a furnace opening 4 that is opened in a lower part of thereof. The furnace opening 4 of the reaction tube 5 is provided with a lid member 6 capable of being elevated and lowered so as to open and close the furnace opening 4. A heater (heating mechanism) 7, which is capable of heating an inside of the reaction tube 5 to a predetermined temperature of, e.g., 300° C. to 1200° C. (sometimes 10000° C. or less in a case of a wafer of a super-large diameter) is located so as to surround a circumference of the reaction tube 5.

In the housing 2, there is horizontally disposed a base plate 8, made of SUS, for example, on which the reaction tube 5 and the heater 7 that constitute the heat processing furnace 3 can be placed. The base plate 8 has an opening, not shown, through which the reaction tube 5 can be inserted upward from below.

An outward flange part, not shown, is formed on a lower end of the reaction tube 5. By holding the flange part onto the base plate 8 by a flange holding member, the reaction tube 5 is installed, with the opening of the base plate 8 being opened. The reaction tube 5 can be detached downward from the base plate 8 for cleaning or the like. Connected to the reaction tube 5 are a plurality of gas introducing pipes through which a process gas and an inert gas for purge are introduced into the reaction tube 5, a vacuum pump capable of depressurizing the inside of the reaction tube 5, and an exhaust pipe provided with a pressure control valve (illustration omitted).

Inside the housing 2, there is provided below the base plate 8 a working area (loading area) 10 in which the boat (holder) 9 placed on the lid member 6 is loaded into the heat processing furnace 3 (i.e., reaction tube 5) and unloaded from the heat processing furnace 3, or a wafer w is transferred to and from the boat 9. The working area 10 is provided with an elevating mechanism 11 for elevating and lowering the lid member 6 so as to load and unload the boat 9. The lid member 6 is brought into contact with an opening end of the furnace opening 4 so as to hermetically seal the furnace opening 4. Disposed on a lower part of the lid member 6 is a rotating mechanism, not shown, for rotating the boat 9.

The illustrated boat 9 has a body part 9a made of, e.g., quartz, and a leg part 9b that supports the body part 9a. The body part 9a horizontally supports, in a tier-like manner, a number of, e.g., about 50 to 75 wafers w of a large diameter at predetermined intervals (pitches) in the up and down direction via ring-shaped support plates 13. The leg part 9b is connected to a rotating shaft of the rotating mechanism. Disposed between the body part 9a and the lid member 6 is a lower heating mechanism, not shown, that prevents lowering of temperature which is caused by a heat radiation through the furnace opening 4. The boat 9 may not include the leg part 9b but include only the body part 9a. In this case, the boat 9 may be placed on the lid member 6 through a heat-retention tube.

The boat 9 has a plurality of, e.g., four columns 12, a top plate 12a attached to upper ends of the columns 12, a bottom plate 12b attached to lower ends of the columns 12, and the ring-shaped support plates 13 that are arranged in a tier-like manner, while being engaged with grooves formed at predetermined pitches in the columns 12. Each of the ring-shaped support plates 13 is made of, e.g., quartz or ceramics, with a thickness of about 2 mm to 3 mm and an outer diameter that is slightly larger than an outer diameter of the wafer w.

A stage (load port) 15 is located in front of the housing 2. A FOUP 14, which is a container containing the plurality of, e.g., about twenty-five wafers w at predetermined intervals therebetween, is placed on the stage 15, and the FOUP 14 is loaded into and unloaded from the housing 2. The FOUP 14 is a hermetically sealable container having a detachable lid, not shown, on a front surface thereof. Disposed in a front part of the working area 10 is a door mechanism 16 that detaches and opens the lid of the FOUP 14 so as to communicate an inside of the FOUP 14 with the working area 10. In the working area 10, there is disposed a wafer transfer apparatus (substrate transfer apparatus) 18 having a fork (support part) 17. The wafer transfer apparatus 17 transfers (conveys) a wafer W between the FOUP 14 and the boat 9.

Outside the working area 10, there are disposed, on an upper front part of the working area 10, a storage shelf part 19 on which the FOUP 14 can be stocked, and a FOUP transfer apparatus, not shown, that transfers the FOUP 14 from the load port 15 to the storage shelf part 19 and vice versa.

Disposed above the working area 10 is a shutter mechanism 20 that covers (or blocks) the furnace opening 4, when the lid member 6 is opened, so as to restrain or prevent a heat in the furnace of a high temperature from being discharged downward to the working area 10 through the furnace opening 4.

The wafer transfer apparatus 18 has a base 21 which is elevatable and rotatable. To be specific, as shown in FIG. 2, the wafer transfer apparatus 18 has: an elevating arm 23 (elongate in a direction perpendicular to the plane of the drawing of FIG. 2(*a*)) capable of being moved in the up and down direction (elevated and lowered) along a vertical guide 22 by a ball screw, not shown); a horizontal moving table 24 capable of being horizontally moved along a longitudinal direction of the elevating arm 23 by a ball screw; and the base 21 of a horizontally elongated box shape, which is rotatably disposed in the horizontal direction on the horizontal moving table 24 via a rotation driving part 25. A moving member 27 that supports a proximal end of one fork 17 is disposed on the base 21 such that the moving member 27 can be reciprocated in a longitudinal direction of the base 21, i.e., in the horizontal direction. Disposed inside the base 21 is a moving mechanism, not shown, for reciprocating the moving member 27. The vertical heat processing apparatus 1 is equipped with a controller 41 that controls the wafer transfer apparatus 18. In the wafer transfer apparatus 18 shown in FIG. 3, the fork 17 includes a reference plate, which is different from a wafer transfer apparatus (having a reference plate separately from a fork) shown in FIG. 7.

The fork 17 is formed to have an elongated plate shape along the longitudinal direction of the base 21. As shown in FIGS. 3 and 4, disposed on a lower part of the fork 17 is an upside grip mechanism 28 capable of supporting a wafer w from above from a front side and a rear side of the wafer w. The upside grip mechanism 28 has: a fixed support part 28a disposed on a front end of the fork 17 so as to support a front periphery of a wafer w; a movable support part 28b disposed on a rear end of the fork 17 so as to disengageably support a rear periphery of the wafer w; and a driving part such as an air cylinder 28c that drives the movable support part 28b in the back and fourth direction (between a position in which a wafer is gripped and a position in which the wafer is released).

Each of the fixed support part 28a and the movable support part 28b has: a vertical portion 28x extending vertically downward from the lower surface of the fork 17; and a hook portion 28y projecting from the vertical portion 28x toward the center of the wafer w, the hook portion 28y having a tapered upper surface. A peripheral portion of the wafer w is supported on the upper surfaces of the hook portions 28y. As described below, positioning of the wafer w is performed as follows. At first, the wafer w is floated from the upper surfaces of the hook portions 28y by a non-contact sucking and holding part 30, and a gas is tangentially blown to the wafer w so as to horizontally rotate the wafer w. Upon stop of the tangential gas blowing, the rotation of the wafer w is stopped by sandwiching the wafer w between the vertical portions 28x. When the wafer w is rotated, it is preferable that the wafer w is sufficiently sucked and floated such that the peripheral portion of the wafer w does not contact the hook portions 28y.

In order to prevent an upper surface (surface to be processed) of the wafer w from contacting the lower surface of the fork 17, a spacer 29 is disposed on the lower surface of the fork 17 on a distal end side thereof. In order that there is formed a predetermined space between the lower surface of the fork 17 and the upper surface of the wafer w, a lower surface of the spacer 29, which receives the front peripheral side of the wafer w, is tapered. As a material of the fixed support part 28*a*, the movable support part 28*b*, and the spacer 29, a heat-resistant resin such as PEEK (Poly Ether Ether Ketone) is preferred.

When the ring-shaped support plate 13 has an outer diameter that is larger than that of the wafer w, cutouts (illustration omitted) are preferably provided so as to avoid an intervention between the ring-shaped support plate 13 and the fixed support part 28*a* and the movable support part 28*b*. When the outer diameter of the ring-shaped support plate 13 is smaller than that of the wafer w, such cutouts are dispensable.

The fork 17 has the non-contact sucking and holding part (which can be also referred to as "non-contact absorbing and holding part") 30 that sucks and holds a wafer w in a non-contact manner through an air layer (gas layer) 50, by blowing a gas onto the central portion of the upper surface of the wafer w and sucking the central portion such that the central portion of the wafer w is not warped. A principle of a so-called air bearing is applied to the non-contact sucking and holding part 30. The air layer 50 includes a thin film-like layer (air film). The non-contact sucking and holding part 30 has a suction nozzle (negative pressure nozzle, suction hole) 31 disposed on the lower surface (lower part) of the fork 17 so as to face the central portion, e.g., the middle point in the illustrated example, of the upper surface of the wafer w, and a plurality of blow nozzles (positive pressure nozzles, blow holes) 32 circumferentially disposed at equal intervals therebetween about the suction nozzle 31. The suction nozzle 31 sucks an atmosphere between the lower surface of the fork 17 and the upper surface of the wafer w, i.e., the suction nozzle 31 creates a negative pressure therebetween to thereby absorb the wafer w. The blow nozzles 32 blow a gas between the lower surface of the fork 17 and the upper surface of the wafer w, i.e., the blow nozzles 32 create a positive pressure therebetween to thereby keep the wafer w away from the lower surface of the fork 17 (in other words, the blow nozzles 32 form the air layer 50 between the lower surface of the fork 17 and the upper surface of the wafer w).

The suction nozzle 31 is connected to a suction source, such as a vacuum pump (illustration omitted), through a suction flow path 33. The blow nozzles 32 are connected to a gas pressure source, such as a gas cylinder or a compressor (illustration omitted), through an annular flow path 34 and a pressure flow path 35. The gas may be an air, but an inert gas such as a nitrogen gas is preferred. The suction flow path 33, the annular flow path 34, and the pressure flow path 35 may be pipes.

In order to perform positioning (alignment) of a wafer w which is supported by the fork 17, the fork 17 has a blow nozzle for rotation 36 and a positioning part 37. The blow nozzle for rotation 36 rotates the wafer w about an axis thereof, by blowing a gas, such as a nitrogen gas, onto the upper surface of the wafer w in a tangential direction. The positioning part 37 arranges the wafer w in position, by detecting a positioning mark (illustration omitted) provided on the wafer w. The number of the blow nozzle for rotation 36 may be one (for rotating a wafer w in one direction). However, in terms of the effective positioning, it is preferable that the two blow nozzles for rotation 36 are provided in different orientations so as to rotate the wafer w in opposite directions. Preferably, an on-off valve (solenoid valve) 38 is disposed between the blow nozzle for rotation 36 and the pressure flow path 35. The positioning mark may be a notch, but a punch mark punched on a peripheral surface of a wafer by a laser marker is preferred.

The positioning part 37 has a sensor that detects the positioning mark on a wafer w. Based on a detection signal of the sensor, the controller 41 controls blowing of a gas (including a blowing direction) from the blow nozzle for rotation 36. Then, the controller 41 stops the rotation of the wafer w by closing the upside grip mechanism 28, such that the positioning mark of the wafer is aligned with the position of the positioning part 37.

In the FOUP 14, there are formed, at predetermined pitches, pockets (receiving grooves) each having a predetermined groove width for receiving and supporting opposed peripheral sides of a wafer w in parallel. However, for some reason or other, there is case in which a wafer w is received in an inclined manner in the right and left direction. In this case, it is difficult for the upside grip mechanism 28 to grip the inclined wafer. Thus, the fork 17 has a displacement sensor 39 that optically detects an inclination of a wafer w, and a posture control mechanism 40 that makes the fork 17 in parallel with the wafer w based on a detection signal from the displacement sensor 39. For example, a super small displacement sensor of a laser type is used as the displacement sensor 39. The displacement sensor 39 detects three points, for example, on the wafer w, and calculates a mid point and an inclination of the wafer w.

Figure 5:
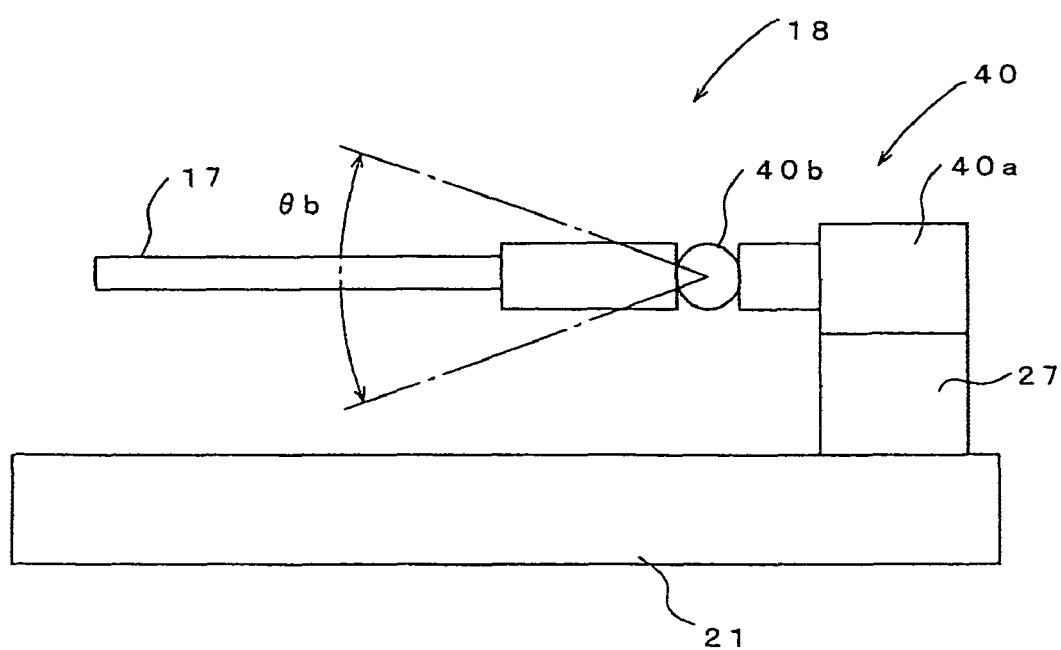
FIG. 5 is a schematic side view for explaining a posture control mechanism of the support part.
Figure 6:
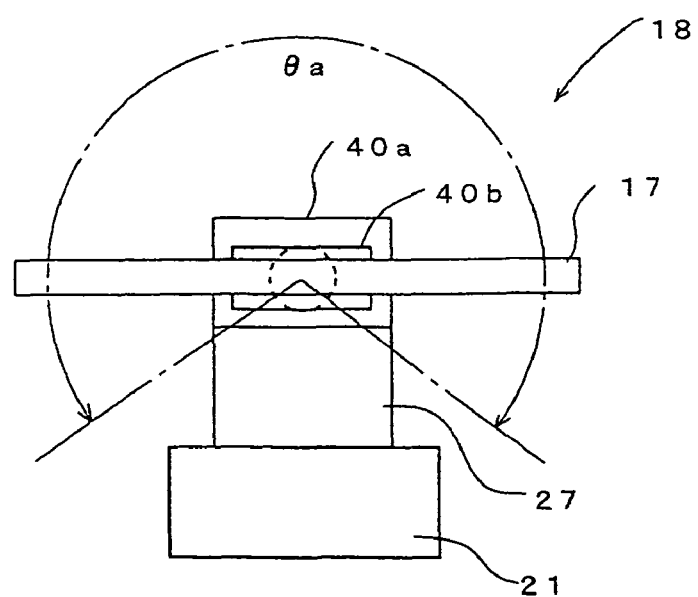
FIG. 6 is a schematic front view for explaining the posture control mechanism of the support part.

FIG. 5 is a schematic side view for explaining the posture control mechanism of the support part, and FIG. 6 is a schematic front view for explaining the posture control mechanism of the support part. In this embodiment, the posture control mechanism 40 of the fork 17 has a first inclination stage 40*a* for a right and left inclination, and a second inclination stage 40*b* for a back and fourth inclination. A proximal portion of the first inclination stage 40*a* is attached to the moving member 27 of the wafer transfer apparatus 18, and a proximal portion of the second inclination stage 40*b* is attached to an output part of the first inclination stage 40*a*. A proximal end of the fork 17 is attached to an output part of the second inclination stage 40*b*. An angle of the fork 17 can be adjusted by the first inclination stage 40*a*, which is located along a center line of the fork 17, within a range of a predetermined angle θa, e.g., within a range of 180°+α, about a rotational center of the first inclination stage 40*a*. In addition, an angle of the fork 17 can be adjusted by the second inclination stage 40*b* within a range of a predetermined angle θb, e.g., within a range of ±10°, about a rotational center of the second inclination stage 40*b*.

The controller 41 is configured to detect and store positional information (including inclinations) of wafers w in the FOUP 14 and in the boat 9 by the displacement sensor 39, and to control a posture of the fork 17 by the posture control mechanism 40 based on the positional information. Thus, when a wafer w in the FOUP 14 is inclined, for example, the fork 17 can be inclined in response to (in conformity to) the inclination of the wafer w, whereby the wafer w can be securely gripped from above.

Obstacle sensors 42 for detecting an obstacle are disposed on opposite sides of a distal end of the fork 17. An ultrasonic sensor or a CCD camera can be used as the obstacle sensor 42. It is possible to detect an obstacle beforehand by the obstacle sensors 42 and to store a position thereof in a spatial coordinate of the controller 41, whereby a wafer can be transferred while avoiding the obstacle. Alternatively, when an obstacle is detected during a transfer of a wafer, the transfer of the wafer w can be stopped so as to avoid a collision between the wafer w and the obstacle. Accordingly, the wafer and the apparatus can be prevented from being damaged.

On a distal end of the base 21 of the wafer transfer apparatus 18, there may be provided a mapping sensor 43 (also referred to as "wafer counter") that detects a presence of a wafer w in the FOUP 14 or in the boat 9, and stores the result as positional information. The mapping sensor 43 is composed of a light emitting element 43*a* that emits an infrared light ray, and a light receiving element 43*b* that receives the infrared light ray. By scanning the mapping sensor 43 in the up and down direction along the wafers w held in a tier-like manner in the FOUP 14 or in the boat 9, it is possible to detect a presence of the wafer w in each tier in the FOUP 14 or in the boat 9, and to store (map) the result as positional information in a storage part of the controller 41. In addition, it is possible to detect a condition of a wafer w before and after a process (for example, leap-out of the wafer w).

The wafer transfer apparatus 18 as structured above includes the fork 17 that is moved above a wafer w of a large diameter, and the upside grip mechanism 28 disposed on the fork 17, which supports the peripheral portion of the wafer w from above. The fork 17 is provided with the non-contact sucking and holding part 30 that holds the wafer w in a non-contact manner, by blowing a gas onto the central portion of the upper surface of the wafer w and sucking the central portion such that the central portion of the wafer w is not warped. Thus, the central portion of the wafer w can be sucked and floated such that the wafer w can be held in a non-contact manner by the non-contact sucking and holding part 30. Accordingly, it is possible to restrain or prevent, during a transfer of the wafer w, the central portion of the wafer w from being warped by its own weight, which might be caused by a super-enlargement of a diameter of the wafer w. As a result, it is possible to restrain or prevent generation of a stress and deterioration of a transfer precision, which might be caused by the warp of the wafer w. In particular, when the wafer is transferred in the up and down direction (in the vertical direction), an air pressure is applied to the surface of the wafer. Thus, when the wafer of a super-large diameter is transferred at a high speed, the wafer might be vulnerable to a stress because of its large surface area and reduced thickness. However, since the wafer is held on the central portion, the stress can be mitigated.

In the non-contact sucking and holding part 30, the suction nozzle 31 is located at the center thereof, and the plurality of blow nozzles 32 are located to surround the suction nozzle 31. Thus, the air layer 50 can be formed between the fork 17 and a wafer w, so that the wafer w can be sucked and floated (absorbed) in a non-contact manner. Due to the non-contact sucking and holding part 30, it is possible to restrain the central portion of the wafer w from being vibrated in the up and down direction (to achieve a vibration-free state), to thereby restrain scattering of particles.

The fork 17 is provided with the blow nozzle for rotation 36 that blows a gas onto the upper surface of a wafer w in the tangential direction so as to rotate the wafer w, and the positioning part 37 that detects a positioning mark on the wafer w so as to arrange the wafer w in position. Thus, it is possible to perform positioning of the wafer (positioning of a crystal direction, alignment) on the fork 17, while the wafer is being transferred. This eliminates the need for a positioning apparatus, which has been conventionally disposed in a housing, and the need for a step for transferring a wafer to the positioning apparatus. Accordingly, the structure can be simplified, and a throughput can be improved.

In addition, the fork 17 is provided with the displacement sensor 39 that optically detects an inclination of a wafer w, and the posture control mechanism 40 that makes the fork 17 in parallel with the wafer w based on a detection signal from the displacement sensor 39. Thus, even when a wafer w is inclined in the FOUP 14, the fork 17 can be inclined in conformity to the inclination of the wafer w so as to be in parallel with the wafer w. Thus, the wafer w can be securely gripped from above by the upside grip mechanism 28. The posture control mechanism 40 can biaxially control a posture of the fork 17 by means of the first inclination stage 40*a* and the second inclination stage 40*b*. Thus, the fork 17 can be easily moved, as if a palm is moved, so as to be in parallel with the wafer surface, which enables a precise transfer of the wafer. Even when a wafer is inclined, the inclined posture of the wafer can be corrected into a horizontal posture and then the wafer can be transferred. Therefore, the wafer can be transferred softly, which prevents damage of the wafer and generation of particles.

A wafer w can be transferred upside down by the first inclination stage 40*a*. It is possible to automatically correct a posture of the fork 17 by the displacement sensor 39 which recognizes a position of the wafer surface. In addition, simply by recognizing a position of an upper surface of an uppermost wafer in the boat, it is possible to recognize an exact coordinate based on positional information of the wafer surface and pitch information in the boat. Accordingly, teaching can be simplified.

Figure 7:
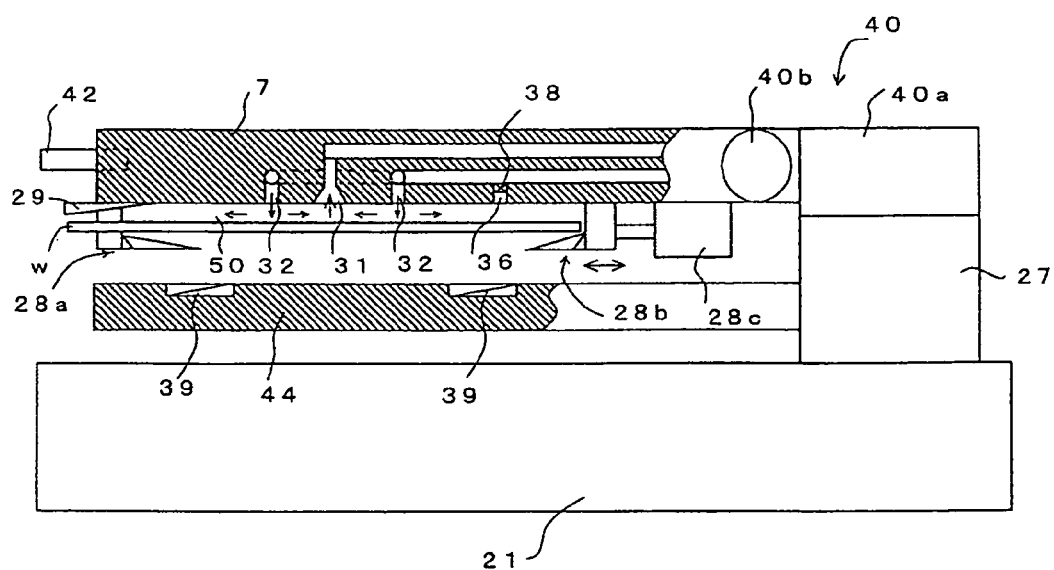
FIG. 7 is a longitudinal sectional view schematically showing another embodiment of the substrate transfer apparatus.

FIG. 7 is a longitudinal sectional view schematically showing another embodiment of the substrate transfer apparatus. In the embodiment in FIG. 7, the same parts as those of the embodiment shown in FIG. 3 are shown by the same reference numbers, and a detailed description thereof is omitted. In the embodiment shown in FIG. 7, a reference plate 44 is disposed below a fork 17. The reference plate 44 is equipped with a displacement sensor 39 that optically detects an inclination of a wafer W. A proximal end of the reference plate 44 is attached to a moving member 27 of a wafer transfer mechanism 18, and a distal end of the reference plate 44 is horizontally extended forward in a cantilevered manner like the fork 17. The displacement sensor 39 detects a displacement (inclination) of a lower surface of a wafer w, and a posture control mechanism 40 controls a posture of the fork 17 so as to be in parallel with the wafer w based on a detection signal from the displacement sensor 39.

According to the wafer transfer apparatus in this embodiment, the same effect as that of the aforementioned embodiment can be obtained.

Figure 8:
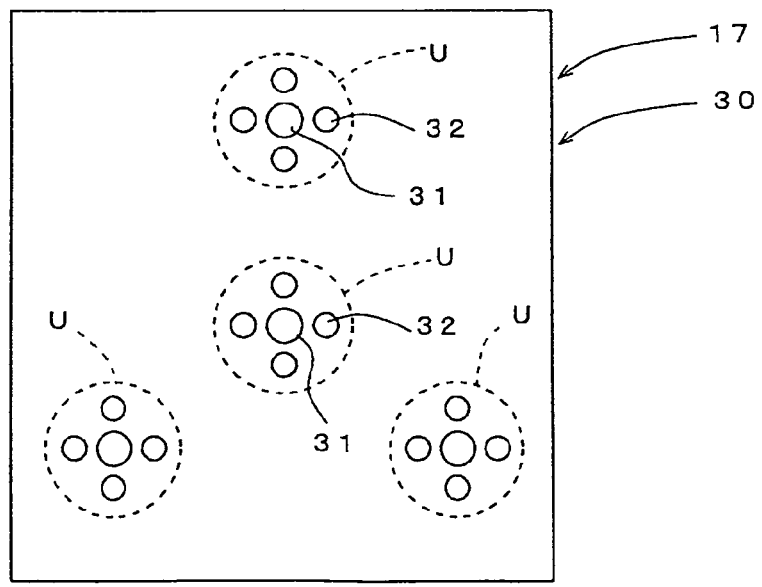
FIG. 8 is a view showing another example of a non-contact sucking and holding part.
Figure 9:
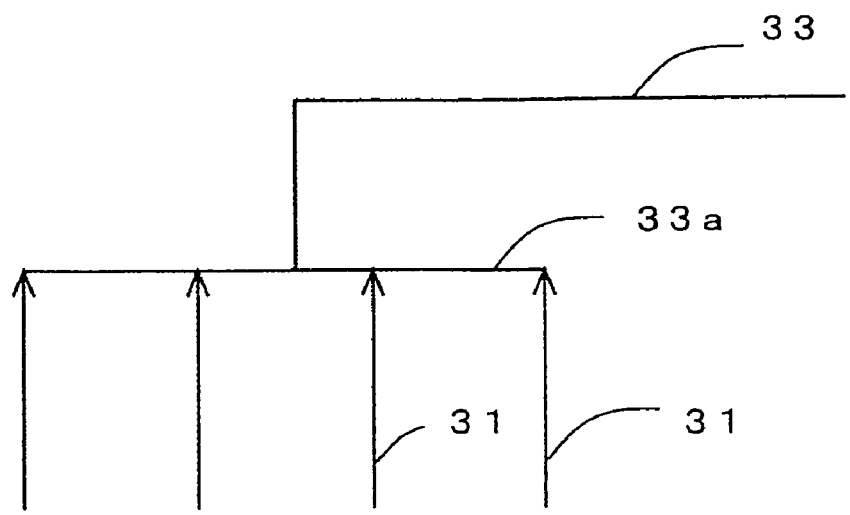
FIG. 9 is a schematic view schematically showing a suction flow path of the non-contact sucking and holding part.
Figure 10:
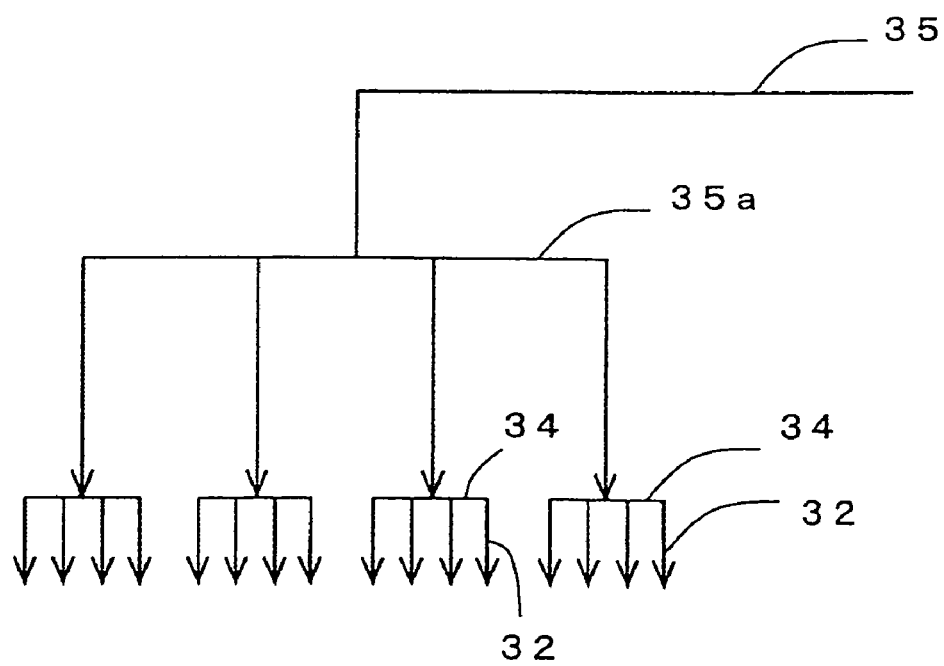
FIG. 10 is a schematic view schematically showing a pressure flow path of the non-contact sucking and holding part.

FIG. 8 is a view showing another example of the non-contact sucking and holding part. FIG. 9 is a schematic view schematically showing a suction flow path of the non-contact sucking and holding part. FIG. 10 is a schematic view schematically showing a pressure flow path of the non-contact sucking and holding part. A non-contact sucking and holding part 30 in this embodiment includes a plurality of, e.g., four non-contact sucking and holding units U each having a suction nozzle (suction hole) 31 located at a center of the unit U, and a plurality of, e.g., four blow nozzles (blow holes) 32 located around the suction nozzle 31. Namely, the three units U are arranged at equal intervals therebetween around the central one unit U. In this case, as shown in FIG. 9, a suction flow path 33 is connected to the suction nozzles 31 of the respective units through a distribution flow path 33*a*. Further, as shown in FIG. 10, a pressure flow path 35 is connected to the blow nozzles 32 of the respective units through a primary distribution flow path 35*a* and secondary distribution flow paths (e.g., annular flow paths) 34.

A holding force of the non-contact sucking and holding part 30 was measured in a performance test. The result is as follows.

TABLE 1

| | | |
|---|---|---|
| Flow Rate L/min | 50 | 40 |
| Floating Height mm | 0.153 | 0.141 |

TABLE 1-continued

| Holding Force mm | 721.7 | 794 |
| Floating Position mm | 0.928 | 0.915 |
| Pressure kPa | −51.6 | −63.1 |

In Table 1, the flow rate means a flow rate of a gas (dry air) that is pressure-fed to the pressure flow path 35 at a predetermined pressure such as 0.2 MPa. The floating height means a distance between the wafer w on the stable holding position and the non-contact sucking and holding part 30. The holding force means a force holding the wafer. The floating position means a distance between the wafer which is initially sucked and the non-contact sucking and holding part 30. The pressure means a pressure in the suction flow path 33. An effective exhaust velocity of a vacuum pump used as a suction source is 60 L/min, and an ultimate pressure thereof is 97.78 kPa.

Figure 11:
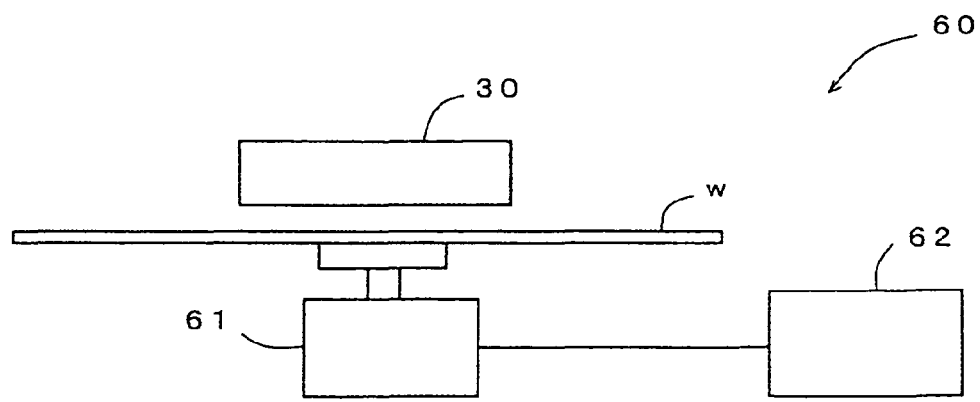
FIG. 11 is a view showing an apparatus for measuring a sucking and holding force.

This performance test was conducted with the use of an apparatus for measuring a sucking and holding force 60 which is shown in FIG. 11. The apparatus for measuring a sucking and holding force 60 is mainly composed of: a load cell 61 onto which a wafer w is adhered; the non-contact sucking and holding part 30 disposed above the wafer w; a height adjusting mechanism (illustration omitted) that adjusts a height of the non-contact sucking and holding part 30 with respect to the wafer w; and a digital force gauge 62 that outputs and displays a value detected by the load cell 61.

The holding force obtained in the performance test was 721.7 g when a flow rate of the pressure-fed gas was 50 L/min, and was 794 g when a flow rate thereof was 40 L/min. A weight of a 300 mm wafer is 120 g, and a weight of a 450 mm wafer is 450 g. Thus, it was confirmed that both wafers could be reliably held.

Figure 12:
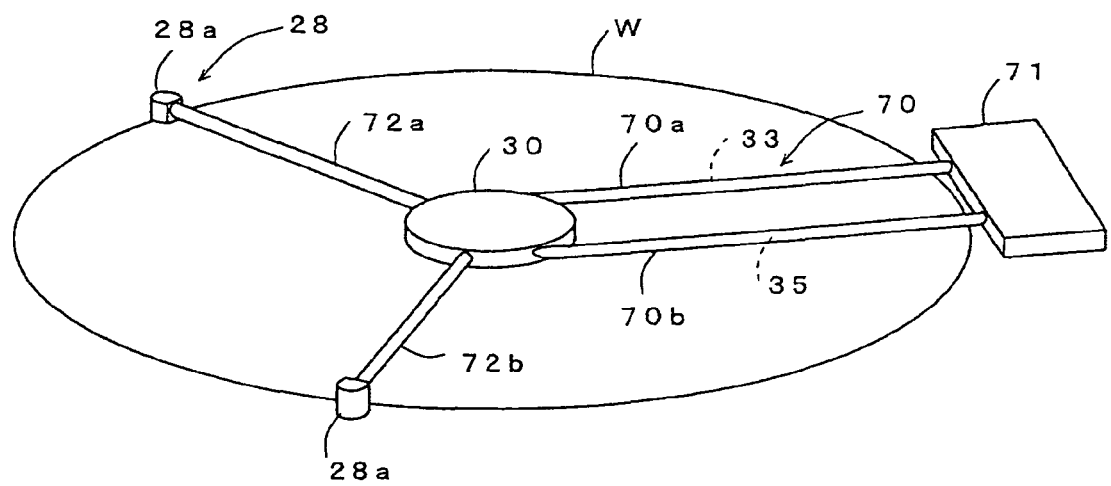
FIG. 12 is a perspective view showing another example of the support part.

FIG. 12 is a perspective view showing another example of the support part. In this embodiment, a support part 70 is not composed of a fork, but of two horizontal pipes 70a and 70b which are in parallel with each other. An inside of the pipe 70a forms a suction flow path 33, while an inside of the pipe 70b forms a pressure flow path 35. Attached to proximal ends of the pipes 70a and 70b is a base member 71 which is attached to a moving member of a wafer transfer apparatus. A non-contact sucking and holding part 30 is attached to distal ends of the pipes 70a and 70b.

Attached to the non-contact sucking and holding part 30 are fixed support parts 28a and 28a of an upside grip mechanism 28 through arm parts 72a and 72b which are diagonally extended forward in the right and left direction. A movable support part (illustration omitted) of the upside grip mechanism 28 is attached to the base member 71. According to the substrate transfer apparatus having the support part 70 in this embodiment, the same effect as that of the aforementioned embodiment can be obtained. In addition, the structure can be simplified.

Figure 13:
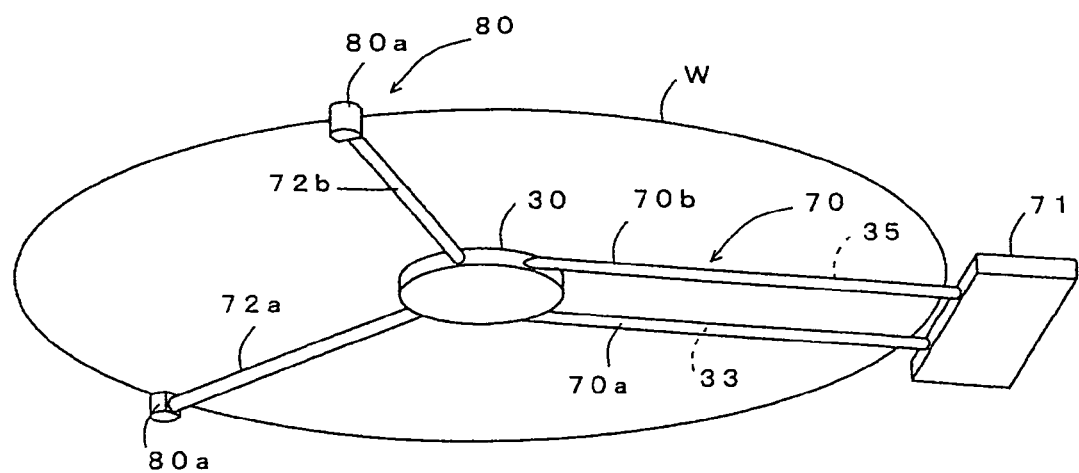
FIG. 13 is a perspective view showing an example of the support part of a downside grip type.

FIG. 13 is a perspective view showing an example of the support part of a downside grip type. As shown in FIG. 13, a substrate transfer apparatus may include a support part 70 that is moved below a wafer w, and a downside grip mechanism 80 that supports a peripheral portion of the wafer w from below, wherein the support part 70 is provided with a non-contact sucking and holding part 30 that sucks and holding the wafer w in a non-contact manner through an air layer, by blowing a gas onto a central portion of a lower surface of the wafer w and sucking the central portion such that the central portion of the wafer w is not warped. The support member 70 of a downside grip type can be obtained by inverting the support part 70 of an upside grip type shown in FIG. 12. Attached to the non-contact sucking and holding part 30 are fixed support parts 80a and 80a of the downside grip mechanism 80 through arm parts 72a and 72b which are diagonally extended forward in the right and left direction. A movable support part (illustration omitted) of the grip mechanism 80 is attached to a base member 71. According to the substrate transfer apparatus having the support part 70 of a downside grip type in this embodiment, a lower central portion of a wafer w can be held in a non-contact manner, and the same effect as that of the aforementioned embodiment can be obtained. In addition, even if a wafer w is unsuccessfully delivered to the boat, the wafer w can be received by the non-contact sucking and holding part 30 whereby the falling-out of the wafer w can be prevented.

The embodiments of the present invention have been described in detail with reference to the drawings. However, the present invention is not limited thereto, and various changes and modifications are possible without departing from the scope of the invention. For example, the wafer transfer apparatus may include a plurality of forks in the up and down direction.

The invention claimed is:

1. A substrate transfer comprising:
   a support part configured to be locatable near a substrate of a predetermined diameter; and
   a grip mechanism disposed on the support part, the grip mechanism being capable of gripping and supporting a peripheral portion of the substrate, wherein
   the support part is provided with a non-contact sucking and holding part having a blow hole that blows a gas onto the substrate, and a suction hole that sucks the gas between the support part and the substrate so that a gas layer for preventing a warp of a central portion of the wafer is formed between the support part and the substrate, and
   the support part is provided with a rotation blow nozzle that rotates the substrate by blowing a gas onto the substrate in a tangential direction, and a positioning part that arranges the substrate in position by detecting a positioning mark on the substrate.

2. A substrate transfer apparatus comprising:
   a support part configured to be locatable near a substrate of a predetermined diameter; and
   a grip mechanism disposed on the support part, the grip mechanism being capable of gripping and supporting a peripheral portion of the substrate, wherein
   the support part is provided with a non-contact sucking and holding part having a blow hole that blows a gas onto the substrate, and a suction hole that sucks the gas between the support part and the substrate, so that a gas layer for preventing a warp of a central portion of the wafer is formed between the support part and the substrate,
   a reference plate is disposed near the support part, the reference plate being provided with a displacement sensor that optically detects an inclination of the substrate, and
   there is installed a posture control mechanism that makes the support part parallel with the substrate based on a detection signal from the displacement sensor.

3. The substrate transfer apparatus according to claim 1 or 2, wherein
   when the support part is located above the substrate, the non-contact sucking and holding part forms the gas layer between the support part and an upper surface of the substrate.

4. The substrate transfer apparatus according to claim 1 or 2, wherein
   the non-contact sucking and holding part includes at least one non-contact sucking and holding unit having the suction hole located at a center of the unit, and the plurality of blow holes located around the suction hole.

5. The substrate transfer apparatus according to claim 1 or 2, wherein
the support part is provided with a displacement sensor that optically detects an inclination of the substrate, and a posture control mechanism that makes the support part parallel with the substrate based on a detection signal from the displacement sensor.

6. A vertical heat processing apparatus comprising:
a heat processing furnace having a furnace opening in a lower part thereof;
a lid member configured to hermetically seal the furnace opening;
a holder disposed on the lid member, the holder being capable of holding a plurality of substrates of a predetermined diameter at predetermined intervals therebetween in a vertical direction through ring-shaped support plates;
an elevating mechanism configured to elevate and lower the lid member so as to load and unload the holder into and from the heat processing furnace; and
a substrate transfer apparatus configured to support a substrate in a substantially horizontal state, and to transfer the substrate between a container capable of containing a plurality of substrates at predetermined intervals therebetween, and the holder,
wherein the substrate transfer apparatus comprises:
a support part configured to be locatable near a substrate of said predetermined diameter; and
a grip mechanism disposed on the support part, the grip mechanism being capable of gripping and supporting a peripheral portion of the substrate, wherein
the support part is provided with a non-contact sucking and holding part having a blow hole that blows a gas onto the substrate, and a suction hole that sucks the gas between the support part and the substrate so that a gas layer for preventing a warp of a central portion of the wafer is formed between the support part and the substrate, and
the support part is provided with a rotation blow nozzle that rotates the substrate by blowing a gas onto the substrate in a tangential direction, and a positioning part that arranges the substrate in position by detecting a positioning mark on the substrate.

7. A vertical heat processing apparatus comprising:
a heat processing furnace having a furnace opening in a lower part thereof;
a lid member configured to hermetically seal the furnace opening;
a holder disposed on the lid member, the holder being capable of holding a plurality of substrates of a predetermined diameter at predetermined intervals therebetween in a vertical direction through ring-shaped support plates;
an elevating mechanism configured to elevate and lower the lid member so as to load and unload the holder into and from the heat processing furnace; and
a substrate transfer apparatus configured to support a substrate in a substantially horizontal state, and to transfer the substrate between a container capable of containing a plurality of substrates at predetermined intervals therebetween, and the holder,
wherein the substrate transfer apparatus comprises:
a support part configured to be located near a substrate of said predetermined diameter; and
a grip mechanism disposed on the support part, the grip mechanism being capable of gripping and supporting a peripheral portion of the substrate, wherein
the support part is provided with a non-contact sucking and holding part having a blow hole that blows a gas onto the substrate, and a suction hole that sucks the gas between the support part and the substrate so that a gas layer for preventing a warp of a central portion of the wafer is formed between the support part and the substrate,
a reference plate is disposed near the support part, the reference plate being provided with a displacement sensor that optically detects an inclination of the substrate, and
there is installed a posture control mechanism that makes the support part parallel with the substrate based on a detection signal from the displacement sensor.

8. The vertical heat processing apparatus according to claim 6 or 7, wherein
when the support part is located above the substrate, the non-contact sucking and holding part forms the gas layer between the support part and an upper surface of the substrate.

9. The vertical heat processing apparatus according to claim 6 or 7, wherein
the non-contact sucking and holding part includes at least one non-contact sucking and holding unit having the suction hole located at a center of the unit, and the plurality of blow holes located around the suction hole.

10. The vertical heat processing apparatus according to claim 6 or 7, wherein the support part is provided with a displacement sensor that optically detects an inclination of the substrate, and a posture control mechanism that makes the support part parallel with the substrate based on a detection signal from the displacement sensor.

* * * * *